United States Patent
Zheng (10) Patent No.: US 10,460,007 B1
(45) Date of Patent: Oct. 29, 2019

(54) SYSTEMS AND METHODS FOR SOLVING INTEGRAL EQUATIONS

(71) Applicant: Ansys, Inc., Canonsburg, PA (US)

(72) Inventor: Dalian Zheng, Superior, CO (US)

(73) Assignee: Ansys, Inc., Canonsburg, PA (US)

( * ) Notice: Subject to any disclaimer, the term of this patent is extended or adjusted under 35 U.S.C. 154(b) by 421 days.

(21) Appl. No.: 15/240,075

(22) Filed: Aug. 18, 2016

Related U.S. Application Data (60) Provisional application No. 62/213,655, filed on Sep. 3, 2015.

(51) Int. Cl.
*G06F 17/12* (2006.01)
*G06F 17/50* (2006.01)
*G06F 17/16* (2006.01)

(52) U.S. Cl.
CPC .......... *G06F 17/12* (2013.01); *G06F 17/16* (2013.01); *G06F 17/5009* (2013.01)

(58) Field of Classification Search
CPC ....... G06F 17/12; G06F 17/16; G06F 17/5009
See application file for complete search history.

(56) References Cited

U.S. PATENT DOCUMENTS

| | | | | |
|---|---|---|---|---|
| 6,314,545 B1 * | 11/2001 | Kapur | ............ | G06F 17/5018 703/1 |
| 7,558,706 B1 * | 7/2009 | Hoyler | ............ | G06F 17/5018 324/457 |
| 7,933,944 B2 * | 4/2011 | Jandhyala | ............ | G06F 17/5009 708/446 |
| 7,945,430 B2 * | 5/2011 | Canning | ............ | G06F 17/5009 703/13 |
| 2009/0177456 A1 * | 7/2009 | Jandhyala | ............ | G06F 17/5018 703/14 |
| 2011/0029295 A1 * | 2/2011 | Okhmatovski | ...... | G06F 17/5018 703/2 |
| 2016/0357884 A1 * | 12/2016 | Makarov | ............ | G06F 17/5018 |

OTHER PUBLICATIONS

Mackenzie, A. et al., "New Basis Functions for the Electromagnetic Solution of Arbitrarily-shaped, Three Dimensional Conducting Bodies Using Method of Moments," p. 1-7, Nasa Langley Research Center, retrieved from https://ntrs.nasa.gov/search.jsp?R=200700149062018-10-11T16:09:47+00:00Z (Year: 2007).*

(Continued)

*Primary Examiner* — Rehana Perveen
*Assistant Examiner* — Steven W Crabb
(74) *Attorney, Agent, or Firm* — Jones Day (57) ABSTRACT

Systems and methods are provided for approximating an electric current on a surface of an object. A mesh is received. A matrix comprising a system of equations is generated based on the mesh. An entry of the matrix is associated with (i) a source function that approximates an electric current on the surface of the object, and (ii) a test function that tests a field of the source function on the surface. A near part of the matrix and a far part of the matrix are determined. The far part of the matrix is represented using a submatrix that is based on Gaussian points on elements of the mesh. The electric current on the surface of the mesh is calculated by solving the system of equations of the matrix.

20 Claims, 6 Drawing Sheets

(56) References Cited

OTHER PUBLICATIONS

Zhao, K. et al., "The Adaptive Cross Approximation Algorithm for Accelerated Method of Moments Computations of EMC Problems," IEEE Transactions of Electromagnetic Compatibility, vol. 47, No. 4 pp. 763-773 (2005) (Year: 2005).*

Oijala, P. et al., "Surface Integral Equation Method for General Composite Metallic and Dielectric Structure with Junctions, " Progress in Electromagnetics Research, PIER 52, pp. 81-108 (2005) (Year: 2005).*

* cited by examiner

Fig. 1

$$f_n(r) = \begin{cases} \dfrac{\rho_n^+}{2A_n^+}, & r \in T_n^+ \\ \dfrac{\rho_n^-}{2A_n^-}, & r \in T_n^- \\ 0, & \text{OTHERWISE,} \end{cases}$$

$$\nabla_s \cdot f_n(r) = \begin{cases} \dfrac{1}{A_n^+}, & r \in T_n^+ \\ -\dfrac{1}{A_n^-}, & r \in T_n^- \\ 0, & \text{OTHERWISE,} \end{cases}$$

WHERE $A_n^\pm$ ARE THE AREAS OF TRIANGLES $T_n^\pm$, RESPECTIVELY.

SYSTEMS AND METHODS FOR SOLVING INTEGRAL EQUATIONS

CROSS-REFERENCE TO RELATED APPLICATIONS

This application claims priority to U.S. Provisional Patent Application No. 62/213,655, filed Sep. 3, 2015, entitled "Method and System for Robust and Efficient Solving of Large Scale Integral Equations Utilizing ACA," which is incorporated herein by reference in its entirety.

FIELD

This disclosure is related generally to computer-aided design and more particularly to systems and methods for solving integral equations. Embodiments of the technology described herein relate to systems and methods for approximating an electric current on a surface of an object.

BACKGROUND

The solving of large-scale electromagnetic applications with objects (e.g., conducting objects, non-conducting objects, semiconductors, etc.) typically requires one or more integral equations to be solved. For instance, to solve large-scale electromagnetic applications with conducting objects in the frequency domain, the method of moments is commonly used in solving the electric field integral equation (EFIE), magnetic field integral equation (MFIE), or combined field integral equation (CFIE) with Rao-Wilton-Glisson (RWG)-type basis functions. In conventional approaches, the solving of such integral equations is computationally expensive, typically requiring relatively large amounts of memory and/or processing resources.

SUMMARY

Systems, methods, and non-transitory computer-readable storage mediums are provided for solving integral equations. In an example computer-implemented method for approximating an electric current on a surface of an object, a mesh that is representative of an object having a surface is received. A matrix comprising a system of equations is generated based on the received mesh. An entry of the matrix is associated with (i) a source function that approximates an electric current on the surface of the object, and (ii) a test function that tests a field of the source function on the surface. A near part of the matrix and a far part of the matrix are determined. The near part comprises contributions from interactions between elements of the mesh that are separated by relatively small distances, and the far part comprises contributions from interactions between elements of the mesh that are separated by relatively large distances. The far part of the matrix is represented using a submatrix that is based on Gaussian points on elements of the mesh. The electric current on the surface of the object is calculated by solving the system of equations of the matrix using an iterative method.

An example computer-implemented system for approximating an electric current on a surface of an object includes a processing system and computer-readable memory in communication with the processing system encoded with instructions for commanding the processing system to execute steps. In executing the steps, a mesh that is representative of an object having a surface is received. A matrix comprising a system of equations is generated based on the received mesh. An entry of the matrix is associated with (i) a source function that approximates an electric current on the surface of the object, and (ii) a test function that tests a field of the source function on the surface. A near part of the matrix and a far part of the matrix are determined. The near part comprises contributions from interactions between elements of the mesh that are separated by relatively small distances, and the far part comprises contributions from interactions between elements of the mesh that are separated by relatively large distances. The far part of the matrix is represented using a submatrix that is based on Gaussian points on elements of the mesh. The electric current on the surface of the object is calculated by solving the system of equations of the matrix using an iterative method.

An example non-transitory computer-readable storage medium for approximating an electric current on a surface of an object includes computer executable instructions which, when executed, cause a processing system to execute steps. In executing the steps, a mesh that is representative of an object having a surface is received. A matrix comprising a system of equations is generated based on the received mesh. An entry of the matrix is associated with (i) a source function that approximates an electric current on the surface of the object, and (ii) a test function that tests a field of the source function on the surface. A near part of the matrix and a far part of the matrix are determined. The near part comprises contributions from interactions between elements of the mesh that are separated by relatively small distances, and the far part comprises contributions from interactions between elements of the mesh that are separated by relatively large distances. The far part of the matrix is represented using a submatrix that is based on Gaussian points on elements of the mesh. The electric current on the surface of the object is calculated by solving the system of equations of the matrix using an iterative method.

The subject matter described herein provides many technical advantages. As described below, according to the techniques of the instant disclosure, a system matrix is represented via two partial system matrices, $Z_{near}$ and $Z_{far}$, which include contributions from near triangle interactions and far triangle interactions, respectively. In embodiments, the $Z_{far}$ partial system matrix is approximated using one or more approximation techniques, thus enabling the system matrix to be solved with a reduced complexity and little or no loss in accuracy. These techniques and others described herein enable the solving of large-scale integral equations in a manner that reduces the computational time, memory, and/or processing resources required, as compared to conventional approaches. These technical advantages and others are described in detail below.

The details of one or more variations of the subject matter described herein are set forth in the accompanying drawings and the description below. Other features and advantages of the subject matter described herein will be apparent from the description and drawings, and from the claims.

DETAILED DESCRIPTION

The present disclosure relates generally to systems and methods for solving integral equations. In embodiments described below, techniques are provided for solving electromagnetic problems (e.g., determining an electric current on a surface of an object, etc.) in a fast, accurate manner that requires less computational time, memory, and/or processing resources as compared to conventional approaches. More particularly, in embodiments of the present disclosure, a mesh that is representative of an object having a surface is received. Based on the received mesh, a system matrix comprising a system of equations is generated, where one or more entries of the system matrix are associated with basis functions that approximate an electric current on the surface of the object. Solving the system of equations of the system matrix provides coefficients for the basis functions, thus enabling the electric current on the surface of the object to be determined.

In embodiments described herein, the system matrix is represented as two partial system matrices, $Z_{near}$ and $Z_{far}$, where the $Z_{near}$ partial system matrix comprises contributions from interactions between elements (e.g., triangles) of the mesh that are separated by relatively small distances, and the $Z_{far}$ partial system matrix comprises contributions from interactions between elements of the mesh that are separated by relatively large distances. In embodiments, the $Z_{far}$ partial system matrix is approximated using one or more approximation techniques, such as the Adaptive Cross Approximation (ACA) algorithm. Further, as described below, in embodiments, the $Z_{far}$ partial system matrix is approximated as a submatrix that is based on Gaussian points (e.g., Gaussian quadrature points) added to elements of the mesh. The submatrix is not based on basis functions, as described below. These techniques and others described herein are used to solve electromagnetic problems in a manner that reduces the computational time, memory, and/or processing resources required, as compared to conventional approaches. It is noted that the present disclosure has a much broader range of applicability than the particular embodiments described herein, and that the systems and methods of the present disclosure may be used to solve integral equations in a wide variety of contexts, devices, and systems (e.g., computer software, computer systems, network devices, computer networks, etc.).

In embodiments described herein, systems and methods utilizing Gaussian-point-based matrix representations are provided for solving large-scale integral equations. These systems and methods are used, in embodiments, for solving electromagnetic field applications (e.g., performing computer-based electromagnetic field simulations for determining electric currents, electric fields, magnetic fields, etc., on or around objects). In embodiments, a matrix is effectively compressed using the Adaptive Cross Approximation (ACA) method to reduce computational time and memory. In contrast to conventional methods for compressing an original system matrix, the techniques of the instant disclosure enable faster setup, applicability to various basis functions, greater accuracy for large frequency ranges, easier handling of bad meshes, and higher efficacy when used with complicated integral equation kernels, such as layered media structure. These technical advantages and others are described in further detail below.

As noted above, to solve large-scale electromagnetic applications with conducting objects in the frequency domain, the method of moments is commonly used in solving the electric field integral equation (EFIE), magnetic field integral equation (MFIE), or combined field integral equation (CFIE) with Rao-Wilton-Glisson (RWG)-type basis functions. The EFIE can be expressed as $$-E_{tan}^{inc}(r)=[-j\omega A(r)-\nabla\phi(r)]_{tan}, \ r \in S \quad (1)$$

where tan indicates the tangential component of the field, $E_{tan}^{inc}(r)$ is the tangential component of the incident electric field, $$A(r)=\mu \int_S G(r,r')J(r')dS', \ r' \in S \quad (2)$$

is the magnetic vector potential, and $$\phi(r) = \frac{1}{-j\omega\epsilon}\int_S G(r,r')\nabla'_S \cdot J(r')dS'. \quad (3)$$

$$r' \in S$$

is the scalar potential.

In (2) and (3), G(r,r') is the integration equation kernel (e.g., the Green's function), and J(r') denotes the unknown surface current. In free space, $$G(r,r') = \frac{e^{-jkR}}{4\pi R},$$

where $k=\omega\sqrt{\mu\epsilon}$, and $R=|r-r'|$ is the distance between field r and source r' points on S. S is the conducting surface. The permeability and permittivity of the surrounding medium are μ and ϵ, respectively.

For a closed conducting object, the MFIE is given as $$\hat{n} \times H^{inc}(r) = \frac{1}{2}J(r) - \hat{n} \times \int_S \nabla \times G(r,r')J(r')dS', \quad (4)$$

$$r \in S$$

where n̂ is the unit outward surface normal, and $H^{inc}$ is the incident magnetic field. The CFIE for a closed conducting object is simply a linear combination of EFIE and MFIE in the form:

$$\beta EFIE + (1-\beta)\frac{1}{jk}MFIE, \quad (5)$$

where β is the combination parameter ranging from 0 to 1, and in general β=0.5 is used.

Figure 1:
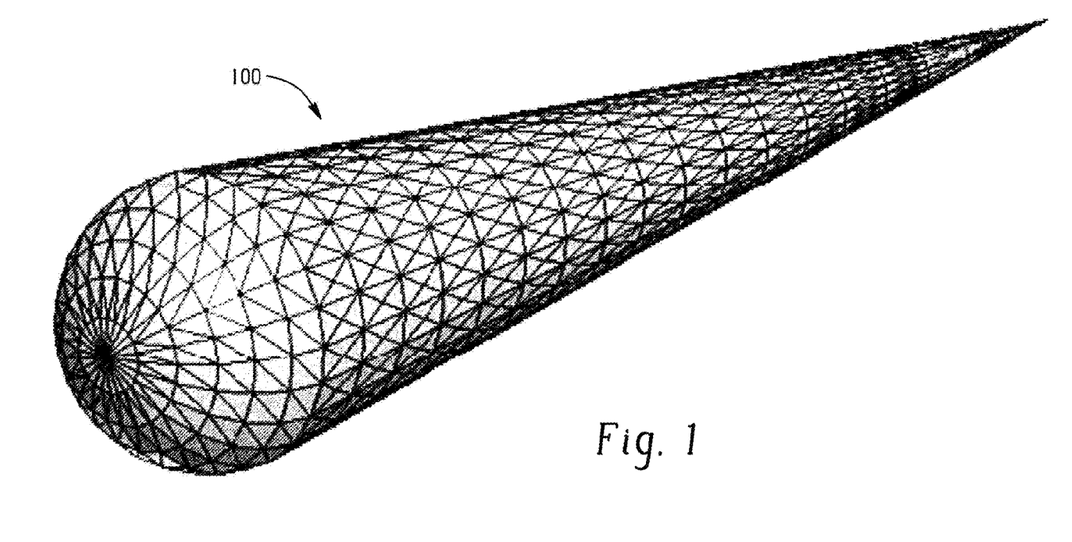
FIG. 1 depicts an example of an object having a surface that is meshed with triangles according to an embodiment of the present disclosure.
Figure 2:
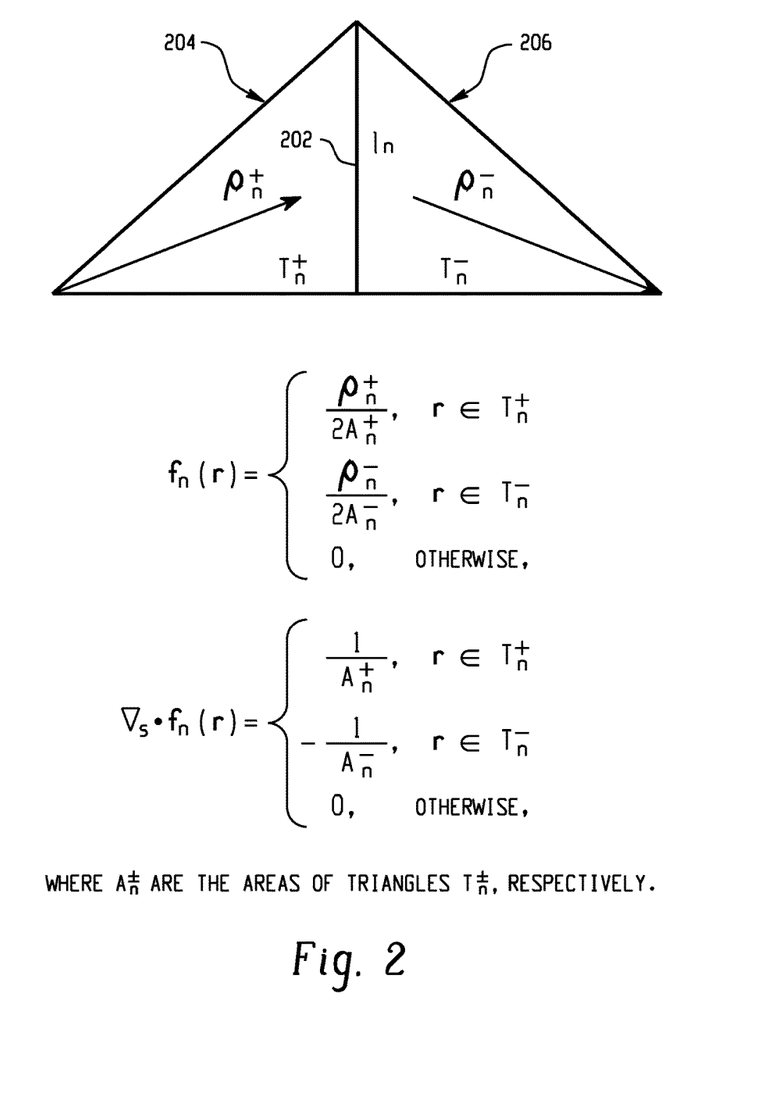
FIG. 2 depicts a basis function defined on the 1-th edge of a triangular mesh according to an embodiment of the present disclosure.

To solve the integral equations, the conducting object may be meshed with triangles. FIG. 1 depicts an example of an object 100 (e.g., a conducting object, a non-conducting object, a semiconductor, etc.) having a surface that is meshed with triangles according to an embodiment of the present disclosure. Although embodiments herein utilize meshing of objects with triangles, it is noted that the systems and methods of the instant disclosure are not limited to this context. Thus, for example, embodiments of the systems and methods described herein utilize rectangular meshes, such that an object is meshed with rectangles. In solving the integral equations, an electric current on the conducting surface S may be approximated using RWG basis function. The approximation of the electric current on the conducting surface S using basis functions is illustrated in FIG. 2, which depicts a basis function associated with an l-th edge 202 defined on two triangles 204, 206 attached to the edge 202. Specifically, the electric current on the conducting surface S is approximated using RWG basis function $$J(r) \cong \sum_{n=1}^{N} I_n f_n(r), \quad (6)$$

where $I_n$ is the total normal component of current crossing the nth interior edge, and N is the number of interior edges in a problem.

In solving an electric field integral equation (EFIE), using (2) and (3) in (1), and testing (1) with $f_m$ results in $$<f_m, -E^i> = -j\omega <f_m, A> + <\nabla_s \cdot f_m, \Phi>, \quad (7)$$

where the inner product is defined as $<f,g> \equiv \int_s f \cdot g \, dS$.

Substitution of (6) into (7) yields an N×N system equation:

$$ZI = V, \quad (8)$$

where Z is an N×N matrix. Its entry associated with testing function $f_m$ and basis function $f_n$ may be represented as $$Z_{mn} = Z_{mn}^A + Z_{mn}^\phi, \quad (9)$$

$$Z_{mn}^A = -j\omega\mu \int_S \int_S f_m(r) \cdot G(r, r') f_n(r') dS' dS, \quad (9a)$$

$$Z_{mn}^\phi = -\frac{1}{j\omega\epsilon} \int_S \int_S \nabla_s \cdot f_m(r) G(r, r') \nabla'_s \cdot f_n(r') dS' dS. \quad (9b)$$

In conventional approaches, to solve Equation (8), an entirety of the system matrix Z is compressed using the ACA algorithm. The ACA algorithm is a purely matrix algebra approach, which does not depend on the integration kernel G in (2) and (3), and has a speed advantage in matrix-vector multiplication over other methods. However, this direct approach with matrix entries utilized in the conventional approaches is relatively slow in matrix setup because the RWG basis function associated with an edge is defined on two triangles which are attached to the edge. This can be seen in FIG. 2, which shows an RWG basis function associated with the l-th edge 202, where the RWG basis function is defined on the two triangles 204, 206 attached to the edge 202. When calculating matrix entries using (9a) and (9b), each matrix entry needs 8 triangle-triangle integrations. For this reason, in the conventional approaches, the ACA scheme becomes even more expensive when dealing with loop-tree/loop-star type basis functions for lower frequency applications, since one "loop" basis function may be associated with many triangles.

The techniques of the instant disclosure eliminate or mitigate one or more of the difficulties described above in using the ACA scheme with vector basis functions. Specifically, in the techniques of the instant disclosure, the vector basis functions are not dealt with directly. Instead, two matrixes associated with triangles are generated, and the ZI of Eq. (8) is obtained effectively by a sum of matrix-vector multiplications. The techniques can easily handle the near interaction integrations and generate results with a high overall accuracy. To further illustrate aspects of the systems and methods described herein, reference is made to FIG. 3. This figure depicts a triangular mesh or a portion thereof, with the triangular mesh being representative of an object having a surface.

In embodiments, the triangular mesh is received as an input (e.g., an input from a user operating a graphical user interface, an input received via a network from a networked computer, an input received at a cloud computing system, etc.). In response to the input, the systems and methods are configured, in embodiments, to solve an electromagnetic problem associated with the received mesh, such as solving for an electric current distribution on the object. Other inputs (e.g., material parameters of the object, excitation parameters such as frequency of electromagnetic excitation, etc.) may further define the electromagnetic problem to be solved. Further, in embodiments, a system matrix comprising a system of equations is generated based on the received mesh. The system matrix is the system matrix Z of Eq. 8, in embodiments, which has one or more entries associated with basis functions that approximate the electric current on the surface of the object. More specifically, in embodiments, an entry of the system matrix is associated with two basis functions (e.g., as illustrated in FIG. 2), where one function (source) approximates an electric current on the surface of the object, and another function (test) tests the field of the source on the surface.

In embodiments, the system matrix Z of Eq. (8) is rearranged into two parts, $Z_{near}$ and $Z_{far}$. The $Z_{near}$ part includes contributions from interactions between triangles of the mesh that are separated by relatively small distances (e.g., contributions from the interaction between triangles that are relatively close). The $Z_{far}$ part includes contributions from interactions between triangles of the mesh that are separated by relatively large distances (e.g., contributions from the interaction between triangles that are relatively far apart). To illustrate this concept, reference is made again to the example of FIG. 3. In this figure, the triangular mesh has been partitioned into four groups of triangles 302, 304, 306, 308. Consider an example case where source triangles are the triangles in groups 1-4 (i.e., groups 302, 304, 306, 308), and test triangles are the triangles in group 1 (i.e., group 302). Source triangles are triangles of the mesh that produce a field (e.g., an electric field, a magnetic field, etc.), and test triangles are triangles of the mesh that receive the field. In embodiments, each triangle of a mesh acts as both a source triangle and a test triangle. In this example case, (i) interactions between triangles in group 1 and other triangles in group 1, and (ii) interactions between triangles in group 1 and triangles in group 2 contribute to the $Z_{near}$ part. This is because these interactions are between triangles that are separated by relatively small distances. Accordingly, to fill the $Z_{near}$ part, the systems and methods described herein loop through near group triangle pairs (Group 1, Group 1) and (Group 1, Group 2) and compute interactions between triangles of these pairs.

Figure 3:
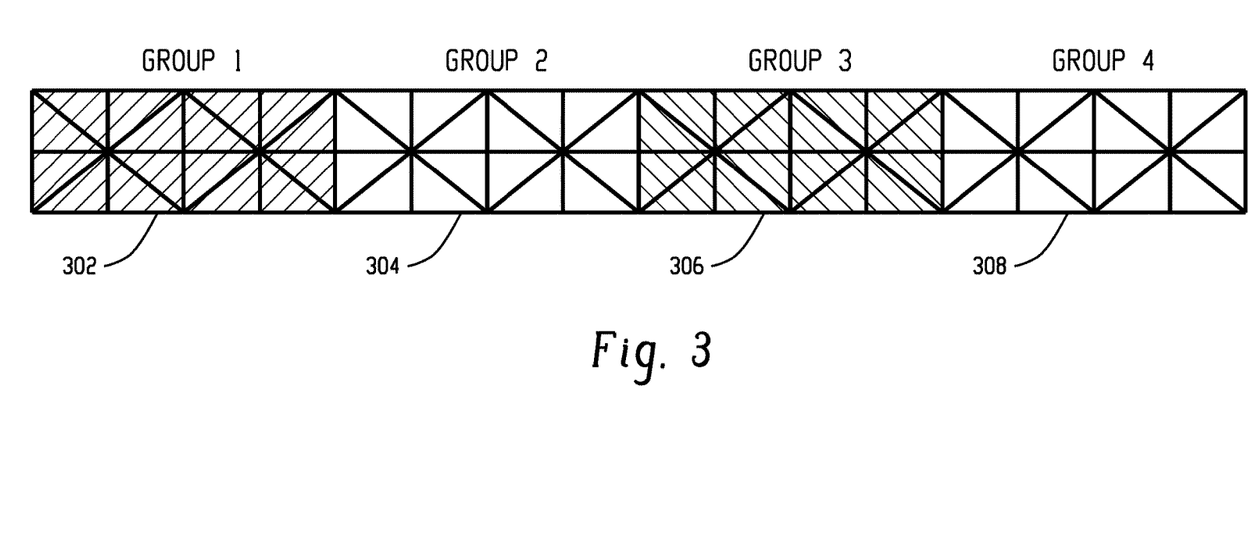
FIG. 3 depicts a partitioning of a triangular mesh into four groups of triangles according to an embodiment of the present disclosure.

Conversely, in this example case, (i) interactions between triangles in group 1 and triangles in group 3, and (ii) interactions between triangles in group 1 and triangles in group 4 contribute to the $Z_{far}$ part. This is because these interactions are between triangles that are separated by relatively large distances. As described below, in embodiments, for far group triangle pairs (e.g., (Group 1, Group 3) and (Group 1, Group 4) in the present example), one or more approximation techniques can be used in determining the $Z_{far}$ part. By contrast, in embodiments, for near group triangle pairs, a highly accurate solving method that does not utilize approximations is used in determining the $Z_{near}$ part. Specifically, as described in further detail below, in embodiments, the systems and methods described herein transfer the $Z_{far}$ part as a sum of matrix products and compress the matrix based on Gaussian quadrature points instead of the original matrix Z. It is noted that the separation of the system matrix Z into the two parts $Z_{near}$ and $Z_{far}$ is based on the triangles of the mesh and is not based on the basis functions. It is further noted that for some entries in the system matrix Z, there are contributions from both $Z_{near}$ and $Z_{far}$.

In embodiments, the $Z_{far}$ part is represented as a matrix product based on mathematical manipulation. An example matrix product is as follows:

$$Z_{far}^{\phi} = -\frac{1}{j\omega\epsilon} P_{\phi}^T G P_{\phi}. \qquad (11)$$

In (11), G is an $N_i \times N_i$ matrix, $G_{ij} = G(r_i, r_j)$, and $N_i$ is the total number of Gaussian quadrature points used on all the triangles. $P_\phi$ is the $N_i \times N$ permutation matrix that maps basis functions to Gaussian quadrature points. $P_\phi$ is a sparse matrix, and each column has 6 nonzero entries when using RWG basis functions, if 3 Gaussian points are used on each triangle. In embodiments, the approximated matrix G is efficiently created using the ACA method with the help of hierarchical matrix partitions, and its low-rank submatrices $G^{mn}$ are stored in outer-product $U^{m \times r} V^{r \times n}$ form in the case of $r(m+n) < m \cdot n$, where r is the rank of the submatrix and is chosen by a predetermined accuracy criterion. Further, in embodiments, to solve Eq. (8), an iterative solver is used, and matrix-vector multiplications are performed on (11).

As noted above, in embodiments, the systems and methods described herein (i) re-arrange the system matrix into the two parts $Z_{near}$ and $Z_{far}$, (ii) fill the near field contributions by looping through near group triangles, (iii) transfer the $Z_{far}$ as a sum of matrix products, and (iv) compress the matrix based on Gaussian quadrature points instead of the original matrix Z, among other operations. In the Gaussian-quadrature-point-based matrix, the matrix entries are smooth, and sub-matrices can be set up quickly. The matrix G described above does not depend on the basis functions, and therefore, the matrix G can be used for both $Z^A$ and $Z^0$. Further, the matrix G can be effectively used for loop-tree/loop-star type of basis functions. These aspects of the instant disclosure are discussed in further detail below.

The systems and methods described herein can be used for curvilinear elements and higher order basis functions. The systems and methods fit well with applications ranging over a wide frequency band by adaptively adding Gaussian quadrature points in a triangle according to a size of the triangle in wavelength. For example, when frequency is low, and the triangle size is very small, one Gaussian point is sufficient for the triangle. Similar principles can also be used for cases with complicated geometries (e.g., geometries in which the triangles are crowded in some areas). Although embodiments herein are described in the context of conducting objects (e.g., determining electric currents on a surface of a conducting object, etc.), it is noted that the systems and methods of the instant disclosure are not limited to this context. Thus, for example, embodiments of the systems and methods described herein are applicable to dielectric problems and mixtures of dielectric and metallic problems since the integral equations for such problems can be constructed by simple linear combinations of Eqs. (1) and (4), obtained by applying different boundary conditions on the interfaces between different materials.

Figure 4:
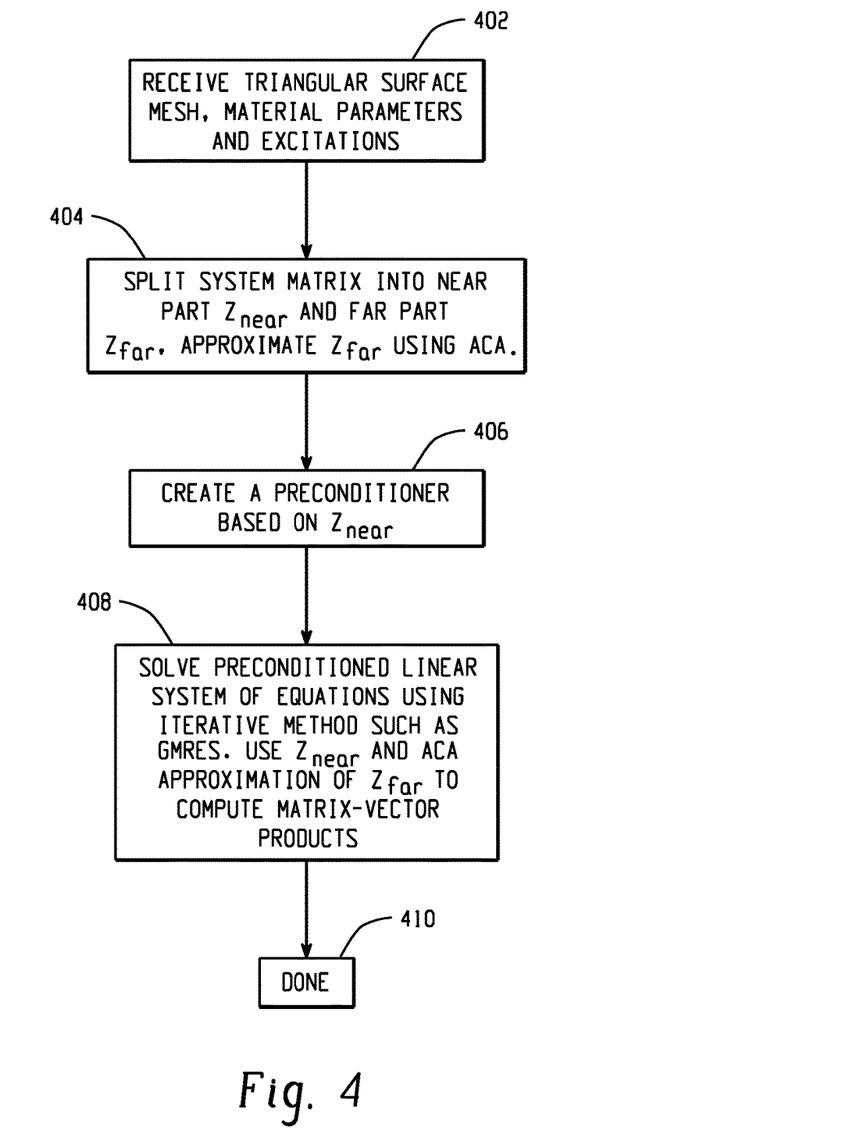
FIGS. 4 and 5 are flow diagrams depicting operations for solving a linear system of equations according to an embodiment of the present disclosure.

FIG. 4 is a flow diagram depicting operations for solving a linear system of equations according to an embodiment of the present disclosure. In particular, the operations depicted in FIG. 4 are used to solve the linear system of Eq. (8), in some embodiments. It is noted that in solving the linear system of Eq. (8), various other operations not depicted in FIG. 4 are performed, in embodiments. Some of these other operations are depicted in the flow diagram of FIG. 5, described below. At a step 402, a surface mesh (e.g., a triangular surface mesh, etc.), material parameters of the meshed object, and excitation parameters (e.g., antenna parameters, frequency of excitation, angle of plane wave excitation, position of excitation source, etc.) are received. In examples, a user provides the mesh for the object geometry that the user desires to simulate/model, along with one or more of the other input parameters noted above. The excitation parameters define the excitation on the system, which is an antenna (e.g., an antenna located around the geometry of the mesh, an antenna located on the geometry of the mesh, an antenna located inside the geometry of the mesh, etc.), point source, or plane wave excitation source, etc., in embodiments. In response to these inputs, the systems and methods are configured, in embodiments, to solve an electromagnetic problem associated with the received mesh, such as solving for an electric current distribution on the object.

At a step 404, the system matrix Z of Eq. (8) is split into a near part $Z_{near}$ and a far part $Z_{far}$, and the $Z_{far}$ part is approximated using the ACA algorithm. In embodiments, in splitting the system matrix into the near part $Z_{near}$ and the far part $Z_{far}$, Eq. (9) with EFIE formulation can be written as $$Z_{mn} = -j\omega\mu \sum_{T_m^{\pm}} \int_{T_m^{\pm}} f_m(r) \cdot \sum_{T_n^{\pm}} \int_{T_n^{\pm}} G(r,r') f_n(r') dS' dS - \qquad (12)$$

$$\frac{1}{j\omega\epsilon} \sum_{T_m^{\pm}} \int_{T_m^{\pm}} \frac{\pm 1}{A_m^{\pm}} \sum_{T_n^{\pm}} \int_{T_n^{\pm}} G(r,r') \frac{\pm 1}{A_n^{\pm}} dS' dS,$$

where $$T_m^{\pm}$$

are triangles associated with basis function $f_m$, and $$A_m^{\pm}$$

are their areas. Example triangles associated with basis functions are depicted in FIG. 2.

In embodiments, to calculate the matrix entry in Eq. (12), one of the special integration methods such as the analytical integration methods may be used to handle the singular or near singular integral kernels when test and source triangles are the same or are close. For far interactions, the regular Gaussian quadrature integration gives very accurate results. Using Gaussian quadrature in Eq. (12) for the numerical integrations, the matrix entry may be written as $$Z_{mn} \cong -j\omega\mu \sum_{T_m^\pm} \sum_i w_i f_m(r_i) \cdot \sum_{T_n^\pm} \sum_j w_j G(r_i, r_j') f_n(r_j') - \qquad (13)$$

$$\frac{1}{j\omega\epsilon} \sum_{T_m^\pm} \sum_{i=1} w_i \frac{\pm 1}{A_m^\pm} \sum_{T_n^\pm} \sum_j w_j G(r_i, r_j') \frac{\pm 1}{A_n^\pm},$$

where $w_i$ and $w_j$ are Gaussian weights on test and basis triangles, respectively, and $r_i$ and $r_j$ are the Gaussian points on test and basis triangles, respectively. It is noted that in the systems and methods described herein, the above quadrature rule formulation is only applied to far field interactions and is not applied for near field interactions. Rather, the near field interactions captured by $Z_{near}$ can be handled using special integration methods. Accordingly, this enables a high level of accuracy to be maintained for $Z_{near}$.

Since in general a triangle has 3 edges and can support one basis function on each edge, Eq. (13) reveals that the double integrations of a pair of triangles may contribute partially for 3×3 matrix entries. To take advantage of this property, in the techniques of the instant disclosure, the N×N matrix in Eq. (8) is represented as $$Z = Z_{near} + Z_{far}, \qquad (14)$$

where $Z_{near}$ and $Z_{far}$ are the partial system matrices contributed from near and far triangle interactions, respectively. An example illustrating contributions from near and far triangle interactions is illustrated in FIG. 3 and described above with reference to that figure. In this manner, special integration methods are used to handle the near field interactions for $Z_{near}$ and a simple fixed point rule is used to handle far field interactions for $Z_{far}$. In embodiments, the $Z_{near}$ part is filled by looping through test and source triangles, computing interactions between such triangles, and adding the contributions if two triangles are close. For $Z_{far}$, instead of dealing directly with the matrix entries, the following expression is utilized:

$$Z_{far} = -j\omega\mu \sum_\alpha P_\alpha^T G P_\alpha - \frac{1}{j\omega\epsilon} P_\phi^T G P_\phi. \qquad (15)$$

$\alpha = x, y,$ and $z$

In Eq. (15), G is an $N_t \times N_t$ matrix, $G_{ij} = G(r_i, r_j)$, and $N_t$ is the total number of Gaussian quadrature points used on all the triangles. $P_\alpha$ is the sparse $N_t \times N$ permutation matrix which maps the $\alpha$ component of the vector basis functions to Gaussian quadrature points. For example, $$P_{x(i,n)} = \begin{cases} \hat{x} \cdot f_n(r_i) w_i, & r_i \in T_n^\pm \\ 0, & \text{otherwise} \end{cases}. \qquad (16)$$

Similarly, $$P_{\phi(i,n)} = \begin{cases} \pm \frac{w_i}{A_n^\pm}, & r_i \in T_n^\pm \\ 0, & \text{otherwise} \end{cases}. \qquad (17)$$

In cases where MFIE is used in Eq. (4), the following is used:

$$Z_{mn}^H = -\sum_{T_m^\pm} \int_{T_m^\pm} \hat{n} \times f_m(r) \cdot \sum_{T_n^\pm} \int_{T_n^\pm} \nabla G(r, r') \times f_n(r') dS' dS \qquad (18)$$

$$= \sum_{T_m^\pm} \int_{T_m^\pm} \sum_{T_n^\pm} \int_{T_n^\pm} \hat{n} \times f_m(r) \cdot [f_n(r') \times (r - r')] G_d(r, r') dS' dS,$$

$m \neq n$ where $$G_d(r, r') = -\frac{(jkR + 1)}{4\pi R^3} e^{-jkR}. \qquad (19)$$

Similar to Eq. (14), the system matrix $Z^H$ for MFIE is represented as $$Z^H = Z_{near}^H + Z_{far}^H. \qquad (20)$$

In Eq. (20), $Z_{far}^H$ is represented as $$Z_{far}^H = \sum_\alpha (P_\alpha^{1T} G_d P_\alpha^2 + P_\alpha^{3T} G_d P_\alpha^4), \qquad (21)$$

$\alpha = x, y,$ and $z$ where $$P_{x(i,n)}^1 = \begin{cases} \hat{x} \cdot (r_i \times \hat{n}_i \times f_n(r_i)) w_i, & r_i \in T_n^\pm \\ 0, & \text{otherwise} \end{cases} \qquad (22)$$

$$P_{x(i,n)}^2 = \begin{cases} \hat{x} \cdot f_n(r_i) w_i, & r_i \in T_n^\pm \\ 0, & \text{otherwise} \end{cases} \qquad (23)$$

$$P_{x(i,n)}^3 = \begin{cases} \hat{x} \cdot \hat{n}_i \times f_n(r_i) w_i, & r_i \in T_n^\pm \\ 0, & \text{otherwise} \end{cases} \qquad (24)$$

and $$P_{x(i,n)}^4 = \begin{cases} \hat{x} \cdot r_i \times f_n(r_i) w_i, & r_i \in T_n^\pm \\ 0, & \text{otherwise} \end{cases} \qquad (25)$$

The system matrix $Z^H$ is not symmetric, while $G_d$ in (21) is symmetric. Therefore, only half of the matrix $G_d$ is created for MFIE or CFIE formulation to save time and memory.

With reference again to FIG. 4, at a step 406, a preconditioner based on $Z_{near}$ is generated, and at a step 408, a preconditioned linear system of equations is solved using an iterative method such as the generalized minimal residual (GMRES) algorithm. Further, at the step 408, the $Z_{near}$ part and the ACA approximation of $Z_{far}$ are used to compute matrix-vector products. At a step 410, the method is complete. It is noted that in embodiments, some of the steps 402, 404, 406, 408, 410 of FIG. 4 are performed simultaneously and not necessarily sequentially, and that in embodiments, the ordering of the steps 402, 404, 406, 408, 410 varies from that depicted in the figure.

Figure 5:
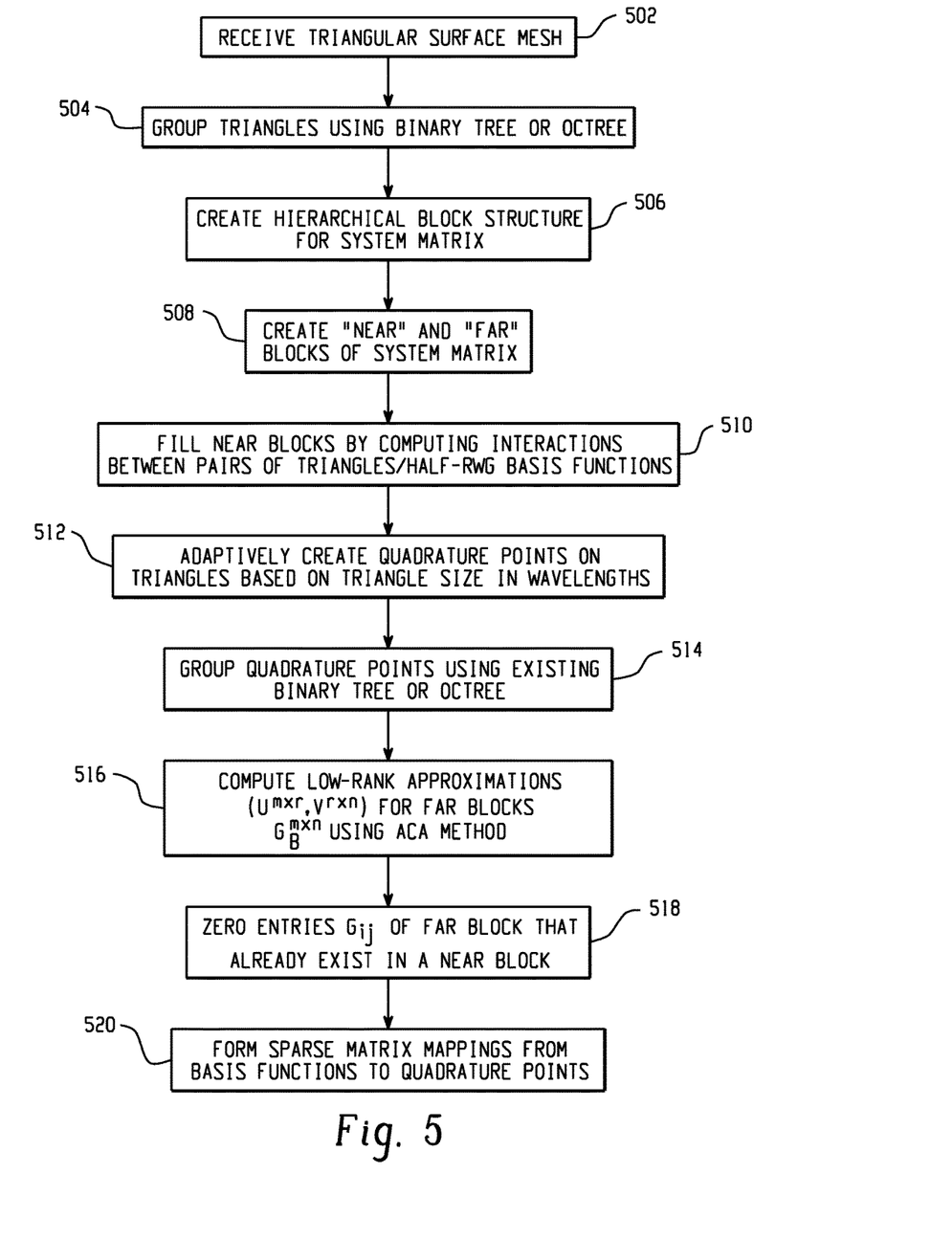

FIG. 5 is another flow diagram depicting operations for solving a linear system of equations according to an embodiment of the present disclosure. In particular, the operations depicted in FIG. 5 are used to solve the linear system of Eq. (8), in some embodiments. The flow diagram of FIG. 5 is specified at a higher level of detail than FIG. 4 and includes more specific details on the splitting of the system matrix Z and approximations that are used in embodiments. At a step 502, a triangular surface mesh is received. An example triangular surface mesh is depicted in FIG. 1. At a step 504, triangles of the surface mesh are grouped using a binary tree technique or an octree technique. At a step 506, a hierarchical block structure is created for the system matrix Z of Eq. (8). Specifically, in embodiments, the system matrix Z is partitioned into a hierarchical structure using the tree created in the step 504.

At a step 508, "near" and "far" parts (e.g., $Z_{near}$ and $Z_{far}$ parts) of the system matrix Z are identified. At a step 510, the near parts are filled by computing interactions between pairs of triangles/half-RWG basis functions. Specifically, in embodiments, to fill the near part $Z_{near}$, the systems and methods of the instant disclosure loop through test and source triangles which belong to the near blocks. Examples of "near" blocks are depicted in FIG. 3 and described above with reference to that figure. When calculating the interaction between two near triangles, 3×3 partial matrix entries are created, in embodiments, and each entry corresponds to the interaction between two half-RWG basis functions on test and source triangles. This enables $Z_{near}$ to be generated in an efficient manner. A half-RWG basis function $$f_n^\pm$$

is the restriction of the basis function $f_n$ to the triangle $$T_n^\pm,$$

as illustrated in FIG. 2 and described above with reference to that figure. In embodiments, the $Z_{near}$ part is stored in a sparse matrix or in block-matrices.

At a step 512, quadrature points are adaptively created on triangles based on sizes of the triangles in wavelength. In examples, a frequency of excitation is provided as an input, and the wavelength under consideration can be determined based on the input frequency. In particular, in embodiments, Gaussian quadrature points are added on each triangle based on the triangle's size in wavelength. In embodiments, if the size of the triangle is relatively small, one point is added to the triangle, and otherwise (e.g., the size of the triangle is determined to be relatively large), three or more points are added to the triangle. A triangle is considered to be large if its area $A \geq 0.5 \cdot (0.1\lambda)^2$, where $\lambda$ is the wavelength under consideration.

At a step 514, Gaussian quadrature points are grouped using the binary tree or octree generated in the step 504. In particular, in embodiments, the Gaussian quadrature points are grouped and re-ordered using the binary-tree or octree partitions generated in the step 504. In embodiments, this step includes replacing a triangle node with the Gaussian points used in the triangle in the tree. At a step 516, low rank approximations $U^{m \times r}$, $V^{r \times n}$ for far blocks $G_B^{m \times n}$ are computed using the ACA algorithm. Specifically, in embodiments, the matrix G is partitioned into a Hierarchical structure using the tree created in the step 514. Most of the sub-matrices correspond to the Gaussian points between two well-separated regions. The sub-matrices $G_B^{m \times n}$ are low rank, and are approximated as $$G_B^{m \times n} \approx U^{m \times r} V^{r \times n}, \quad (26)$$

where m and n are the sub-matrix dimensions, and r is the rank of the matrix. The ACA method is used to construct $G_B^{m \times n}$ in the form of Eq. (26) and set $G_{ij}=0$, if point pair i and j are on the two triangles which belong to near triangle group since the contribution is already included in $Z_{near}$. The setting of $G_{ij}=0$ in such instances is reflected in the step 518 of FIG. 5 (i.e., "Zero entries $G_{ij}$ of the far block that already exist in a near block").

At a step 520, sparse matrix mappings are formed from basis functions to quadrature points. In embodiments, the sparse matrixes in Eqs. (16) and (17) are set up for EFIE, and the sparse matrices in Eqs. (22)-(25) are set up for MFIE. In embodiments, a preconditioner from $Z_{near}$ is generated, as described above with reference to FIG. 4. Eq. (8) is solved using an iterative solver, such as GMRES.

Figure 6:
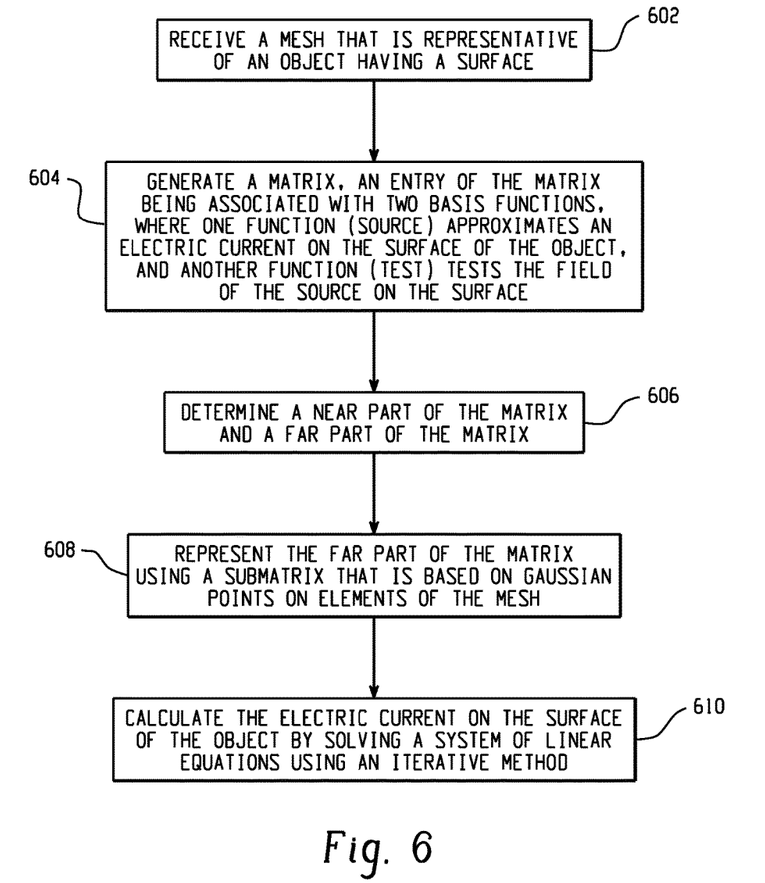
FIG. 6 is a flow diagram depicting operations of a computer-implemented method for approximating an electric current on a surface of an object according to an embodiment of the present disclosure.

FIG. 6 is a flow diagram depicting operations of a computer-implemented method for approximating an electric current on a surface of an object according to an embodiment of the present disclosure. At 602, a mesh that is representative of an object having a surface is received. At 604, a matrix comprising a system of equations is generated based on the received mesh. An entry of the matrix is associated with two basis functions (e.g., as illustrated in FIG. 2), where one function (source) approximates an electric current on the surface of the object, and another function (test) tests the field of the source on the surface. At 606, a near part of the matrix and a far part of the matrix are determined. The near part comprises contributions from interactions between elements of the mesh that are separated by relatively small distances, and the far part comprises contributions from interactions between elements of the mesh that are separated by relatively large distances. At 608, the far part of the matrix is represented using a submatrix that is based on Gaussian points on elements of the mesh. At 610, the electric current on the surface of the object is calculated by solving the system of linear equations of the matrix using an iterative method.

This written description uses examples to disclose the invention, including the best mode, and also to enable a person skilled in the art to make and use the invention. The patentable scope of the invention may include other examples. Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A method for approximating an electric current on a surface of an object, the method comprising:
    receiving a mesh that is representative of an object having a surface, the mesh comprising a plurality of elements, each element belonging to one of a plurality of element groups;
    generating, based on the received mesh, a matrix comprising a system of equations, an entry of the matrix being associated with (i) a source function that approximates an electric current on the surface of the object, and (ii) a test function that tests a field of the source function on the surface;
    determining a first part of the matrix and a second part of the matrix, the first part comprising contributions from interactions between elements belonging to the same element group or to adjacent element groups, and the second part comprising contributions from interactions between elements not belonging to the same element group or to adjacent element groups;
    computing interactions between pairs of source elements producing an electric field and test elements receiving the electric field, wherein the first part of the matrix comprises the interactions computed based on half-RWG (Rao-Wilton-Glisson) basis functions on the pairs of the source elements and the test elements;
    representing the second part of the matrix using a sub matrix that is based on Gaussian points on elements of the mesh; and
    performing a computer-based electromagnetic field simulation to determine the electric current on the surface of the object by solving the system of equations of the matrix using an iterative method.

2. The method of claim 1, further comprising compressing the submatrix using an Adaptive Cross Approximation (ACA) algorithm.

3. The method of claim 1, wherein the source function and the test function comprise basis functions, the method further comprising:
    using a sparse matrix to map Gaussian quadrature points associated with the submatrix to the basis functions.

4. The method of claim 3, wherein the mapping of the Gaussian quadrature points to the basis functions is performed during a matrix multiplication procedure.

5. The method of claim 3, wherein the basis functions comprise Rao-Wilton-Glisson (RWG) basis functions.

6. The method of claim 3, wherein the basis functions are not utilized in the determining of the first part and the second part of the matrix.

7. The method of claim 1, wherein the interactions between elements comprise interactions between source and test elements of the mesh, a source element comprising an element of the mesh that produces an electric field, and a test element comprising an element of the mesh that receives the electric field.

8. The method of claim 7, wherein the mesh comprises a triangular mesh, and the elements of the mesh comprise triangles, the source element comprising a source triangle of the mesh, and the test element comprising a test triangle of the mesh.

9. The method of claim 1, wherein the determining the electric current on the surface of the object does not utilize a direct solving algorithm.

10. The method of claim 1, wherein the mesh comprises a triangular mesh, and the elements of the mesh comprise triangles, the method further comprising:
    grouping and re-ordering the triangles of the mesh using a binary-tree technique or an octree technique, wherein the grouping and re-ordering of the triangles generates a tree structure; and
    partitioning the matrix into a hierarchical block structure using the tree structure.

11. The method of claim 1, wherein the mesh comprises a triangular mesh and the elements of the mesh comprise triangles, the interactions between the elements of the mesh comprising interactions between source and test triangles of the mesh, a source triangle comprising a triangle of the mesh that produces an electric field, and a test triangle comprising a triangle of the mesh that receives the electric field, and wherein the computing of the interactions comprises generating 3×3 partial matrix entries, each of the partial matrix entries corresponding to an interaction computed based on two half-RWG (Rao-Wilton-Glisson) basis functions on a pair of test and source triangles, the method further comprising:
    storing the first part of the matrix in a sparse matrix or in block matrices.

12. The method of claim 11, wherein the representing of the second part of the matrix using the submatrix comprises:
    adding Gaussian quadrature points on each triangle of the mesh, wherein a number of Gaussian quadrature points added to a given triangle of the mesh is based on a size of the given triangle.

13. The method of claim 12, wherein the adding of the Gaussian quadrature points comprises:
    based on a determination that the size of the given triangle is relatively small compared to a wavelength, adding one Gaussian quadrature point to the given triangle; and based on a determination that the size of the given triangle is relatively large compared to the wavelength, adding three or more Gaussian quadrature points to the given triangle.

14. The method of claim 12, further comprising:
grouping and re-ordering the triangles of the mesh using a binary-tree technique or an octree technique, wherein the grouping and re-ordering of the triangles generates a tree structure; and
grouping and re-ordering the Gaussian quadrature points using the tree structure.

15. The method of claim 1, wherein the second part of the matrix is approximated using an ACA algorithm, the determining the electric current comprising:
using (i) the first part of the matrix, and (ii) the second part of the matrix as approximated
using the ACA algorithm to compute matrix-vector products.

16. The method of claim 1, further comprising:
creating a preconditioner based on the first part of the matrix, the solving of the system of equations comprising solving a preconditioned linear system of equations using a generalized minimal residual (GMRES) algorithm.

17. The method of claim 1, further comprising:
computing low-rank approximations for the second part of the matrix using an ACA algorithm; and
zeroing entries of the second part that already exist in the first part of the matrix.

18. The method of claim 1, wherein the mesh comprises a rectangular mesh.

19. A system for approximating an electric current on a surface of an object, the system comprising:
a processing system; and
computer-readable memory in communication with the processing system encoded with instructions for commanding the processing system to execute steps comprising:
receiving a mesh that is representative of an object having a surface, the mesh comprising a plurality of elements, each element belonging to one of a plurality of element groups;
generating, based on the received mesh, a matrix comprising a system of equations, an entry of the matrix being associated with (i) a source function that approximates an electric current on the surface of the object, and (ii) a test function that tests a field of the source function on the surf ace;
determining a first part of the matrix and a second part of the matrix, the first part comprising contributions from interactions between elements of the mesh that belong to the same element group or to adjacent element groups, and the second part comprising contributions from interactions between elements of the mesh that do not belong to the same element group or to adjacent element groups;
computing interactions between pairs of source elements producing an electric field and test elements receiving the electric field, wherein the first part of the matrix comprises the interactions computed based on half-RWG (Rao-Wilton-Glisson) basis functions on the pairs of the source elements and the test elements;
representing the second part of the matrix using a sub matrix that is based on Gaussian points on elements of the mesh; and
performing a computer-based electromagnetic field simulation to determine the electric current on the surface of the object by solving the system of equations of the matrix using an iterative method.

20. A non-transitory computer-readable storage medium for approximating an electric current on a surface of an object, the computer-readable storage medium comprising computer executable instructions which, when executed, cause a processing system to execute steps comprising:
receiving a mesh that is representative of an object having a surface, the mesh comprising a plurality of elements, each element belonging to one of a plurality of element groups;
generating, based on the received mesh, a matrix comprising a system of equations, an entry of the matrix being associated with (i) a source function that approximates an electric current on the surface of the object, and (ii) a test function that tests a field of the source function on the surf ace;
determining a first part of the matrix and a second part of the matrix, the first part comprising contributions from interactions between elements of the mesh that belong to the same element group or to adjacent element groups, and the second part comprising contributions from interactions between elements of the mesh that do not belong to the same element group or to adjacent element groups;
computing interactions between pairs of source elements producing an electric field and test elements receiving the electric field, wherein the first part of the matrix comprises the interactions computed based on half-RWG (Rao-Wilton-Glisson) basis functions on the pairs of the source elements and the test elements;
representing the second part of the matrix using a sub matrix that is based on Gaussian points on elements of the mesh; and
performing a computer-based electromagnetic field simulation to determine the electric current on the surface of the object by solving the system of equations of the matrix using an iterative method.

* * * * *